US010109628B2

(12) United States Patent
Murthy et al.

(10) Patent No.: US 10,109,628 B2
(45) Date of Patent: Oct. 23, 2018

(54) TRANSISTOR DEVICE WITH GATE CONTROL LAYER UNDERCUTTING THE GATE DIELECTRIC

(71) Applicant: INTEL CORPORATION, Santa Clara, CA (US)

(72) Inventors: Anand S. Murthy, Portland, OR (US); Nick Lindert, Portland, OR (US); Glenn A. Glass, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/024,258

(22) PCT Filed: Dec. 18, 2013

(86) PCT No.: PCT/US2013/076232
§ 371 (c)(1),
(2) Date: Mar. 23, 2016

(87) PCT Pub. No.: WO2015/094244
PCT Pub. Date: Jun. 25, 2015

(65) Prior Publication Data
US 2016/0240534 A1 Aug. 18, 2016

(51) Int. Cl.
H01L 29/78 (2006.01)
H01L 29/786 (2006.01)
(Continued)

(52) U.S. Cl.
CPC ...... H01L 27/092 (2013.01); H01L 21/26506 (2013.01); H01L 21/3065 (2013.01);
(Continued)

(58) Field of Classification Search
CPC . H01L 27/092; H01L 27/12; H01L 21/26506; H01L 21/3065;
(Continued)

(56) References Cited

U.S. PATENT DOCUMENTS

2002/0164853 A1  11/2002  Forbes et al.
2003/0080361 A1*  5/2003  Murthy ............... H01L 29/1054
                                                         257/288
(Continued)

FOREIGN PATENT DOCUMENTS

CN  101257046 A  9/2008
CN  102832246 A  12/2012
(Continued)

OTHER PUBLICATIONS

TW Office Action dated Oct. 26, 2016 and Search Report dated Oct. 3, 2016 received for TW Application No. 103139774. 21 pages.
(Continued)

Primary Examiner — Marc Armand
Assistant Examiner — Younes Boulghassoul
(74) Attorney, Agent, or Firm — Finch & Maloney PLLC

(57) ABSTRACT

Techniques are disclosed for improving gate control over the channel of a transistor, by increasing the effective electrical gate length ($L_{eff}$) through deposition of a gate control layer (GCL) at the interfaces of the channel with the source and drain regions. The GCL is a nominally undoped layer (or substantially lower doped layer, relative to the heavily doped S/D fill material) that can be deposited when forming a transistor using replacement S/D deposition. The GCL can be selectively deposited in the S/D cavities after such cavities have been formed and before the heavily doped S/D fill material is deposited. In this manner, the GCL decreases the source and drain underlap ($X_{ud}$) with the gate stack and further separates the heavily doped source and drain regions. This, in turn, increases the effective electrical gate length ($L_{eff}$) and improves the control that the gate has over the channel.

8 Claims, 10 Drawing Sheets

(51) Int. Cl.
*H01L 27/092* (2006.01)
*H01L 21/265* (2006.01)
*H01L 29/66* (2006.01)
*H01L 21/3065* (2006.01)
*H01L 21/8238* (2006.01)
*H01L 29/06* (2006.01)
*H01L 29/40* (2006.01)
*H01L 29/423* (2006.01)
*H01L 29/10* (2006.01)
*H01L 29/165* (2006.01)

(52) U.S. Cl.
CPC .. *H01L 21/823814* (2013.01); *H01L 29/0673* (2013.01); *H01L 29/401* (2013.01); *H01L 29/42392* (2013.01); *H01L 29/66545* (2013.01); *H01L 29/66636* (2013.01); *H01L 29/66795* (2013.01); *H01L 29/785* (2013.01); *H01L 29/78621* (2013.01); *H01L 29/78696* (2013.01); *H01L 29/1045* (2013.01); *H01L 29/165* (2013.01); *H01L 29/7833* (2013.01)

(58) Field of Classification Search
CPC ........... H01L 21/823814; H01L 21/265; H01L 21/8238; H01L 21/336; H01L 21/8242; H01L 21/762; H01L 21/28512; H01L 21/02532; H01L 29/0673; H01L 29/401; H01L 29/42392; H01L 29/66545; H01L 29/66795; H01L 29/785; H01L 29/78696; H01L 29/1045; H01L 29/165; H01L 29/40; H01L 29/78; H01L 29/66; H01L 29/06; H01L 29/786; H01L 29/423; H01L 29/10; H01L 29/7816; H01L 29/167; H01L 29/66681; H01L 29/7848; H01L 29/45; H01L 29/4966; H01L 29/36; H01L 29/0847; H01L 29/66477; H01L 29/66628; H01L 29/78621–29/78627; H01L 29/7833–29/7836; H01L 29/66492; H01L 21/823418; H01L 2029/7863
USPC .. 257/369, 335, 19, 408, E29.255, E21.409; 438/285, 303
See application file for complete search history.

(56) References Cited

U.S. PATENT DOCUMENTS

| | | | |
|---|---|---|---|
| 2005/0121703 A1* | 6/2005 | Hieda | H01L 29/78648 257/288 |
| 2008/0124878 A1* | 5/2008 | Cook | H01L 29/66621 438/300 |
| 2009/0068810 A1 | 3/2009 | Tsai et al. | |
| 2010/0090281 A1 | 4/2010 | Meneghesso et al. | |
| 2010/0219474 A1 | 9/2010 | Kronholz et al. | |
| 2012/0153387 A1* | 6/2012 | Murthy | H01L 21/28512 257/335 |
| 2012/0181625 A1 | 7/2012 | Kwok et al. | |
| 2012/0205715 A1 | 8/2012 | Kwok | |
| 2012/0223364 A1 | 9/2012 | Chung et al. | |
| 2012/0319203 A1* | 12/2012 | Cheng | H01L 29/66666 257/346 |
| 2013/0032864 A1 | 2/2013 | Javorka et al. | |
| 2013/0228826 A1* | 9/2013 | Wang | H01L 21/823807 257/192 |
| 2013/0248999 A1 | 9/2013 | Glass et al. | |
| 2013/0264639 A1 | 10/2013 | Glass et al. | |
| 2013/0277752 A1 | 10/2013 | Glass et al. | |
| 2014/0084350 A1* | 3/2014 | Kim | H01L 29/78 257/255 |

FOREIGN PATENT DOCUMENTS

| | | |
|---|---|---|
| CN | 103270598 A | 8/2013 |
| WO | 0199153 A2 | 12/2001 |
| WO | 2015094244 A1 | 6/2015 |

OTHER PUBLICATIONS

International Search Report as received for Patent Application No. PCT/US2013/076232, dated Sep. 23, 2014. 4 pages.
TW Office Action dated Apr. 22, 2016 and Search Report dated Apr. 13, 2016 dated Apr. 29, 2016 for TW Application No. 103139774. 6 pages.
International Preliminary Report on Patentabiltity and Written Opinion received for PCT Application No. PCT/US2013/076232, dated Jun. 30, 2016, 6 pages.
Extended European Search Report received for EP Application No. 13899916.4, dated Jul. 4, 2017. 10 pages.

* cited by examiner

TRANSISTOR DEVICE WITH GATE CONTROL LAYER UNDERCUTTING THE GATE DIELECTRIC

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal-oxide-semiconductor (MOS) transistor semiconductor devices, such as those used in a complementary metal-oxide-in semiconductor (CMOS), it is often desired to scale pitch for each processing generation to support more transistors per area. Generally, the critical dimensions of transistor gates are scaled down to scale down the overall pitch.

BRIEF DESCRIPTION OF THE DRAWINGS

FIG. 3C' illustrates a cross-sectional view of FIG. 3C taken through the source/drain regions and perpendicular to the gate structure.

DETAILED DESCRIPTION

Figure 1:
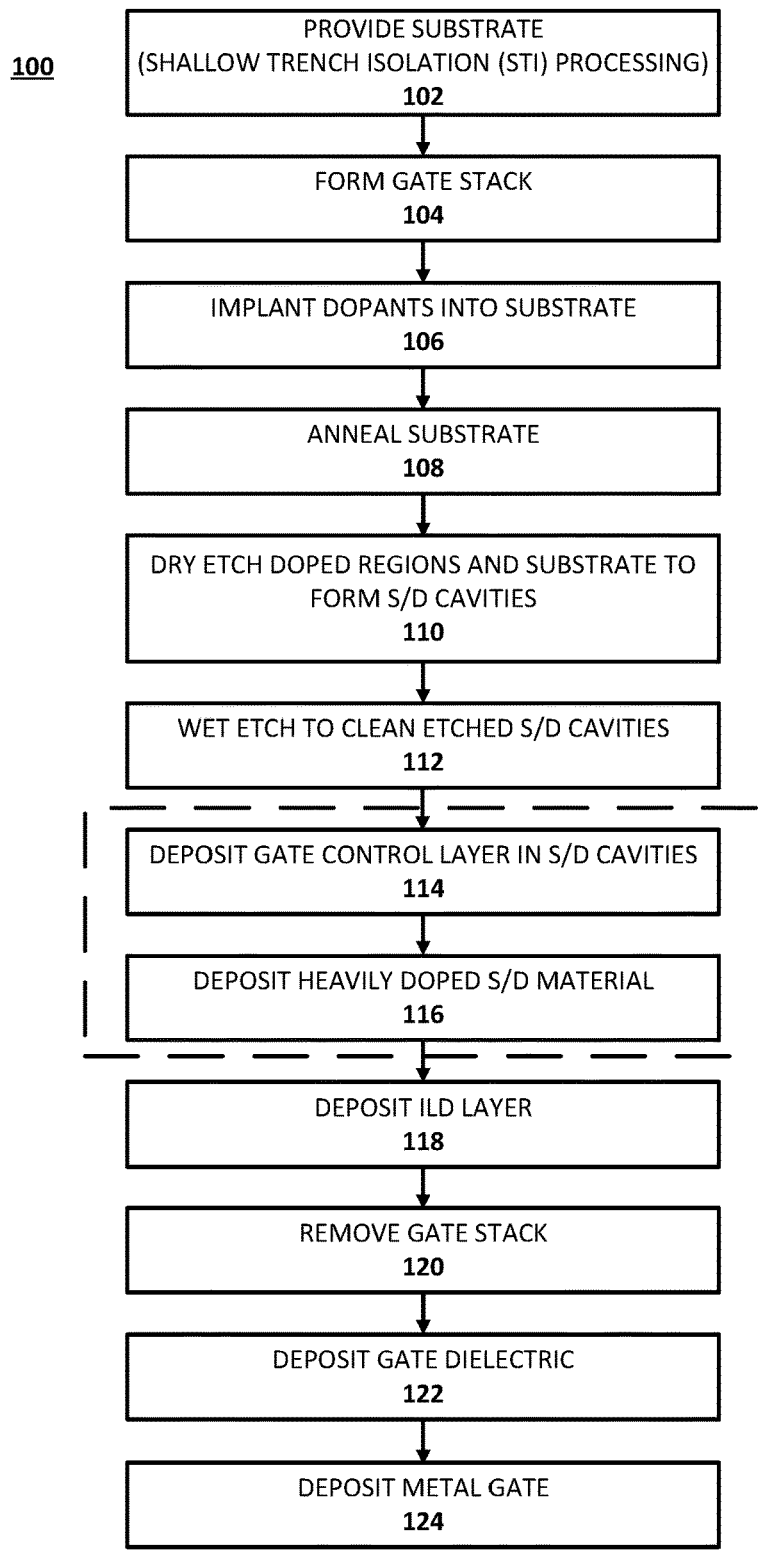
FIG. 1 is a method of forming a metal-oxide-semiconductor (MOS) transistor including a gate control layer (GCL), in accordance with one or more embodiments of the present disclosure.

Techniques are disclosed for improving gate control over the channel of a transistor, by increasing the effective electrical gate length ($L_{eff}$) through deposition of a gate control layer (GCL) at the interfaces of the channel with the source and drain regions. The GCL is a nominally undoped layer (or substantially lower doped layer, relative to the heavily doped S/D fill material) that can be deposited when forming a transistor using replacement S/D deposition. The GCL can be selectively deposited in the S/D cavities after such cavities have been formed and before the heavily doped S/D fill material is deposited. In this manner, the GCL decreases the source and drain underlap distance ($X_{ud}$) with the gate stack and further separates the heavily doped source and drain regions. This, in turn, increases the effective electrical gate length ($L_{eff}$) and improves the control that the gate has over the channel (e.g., by increasing the efficacy of turning off the channel current when gate voltage is removed).

General Overview

As previously explained, the critical dimensions of transistor gates may be scaled down to scale down the overall pitch and support more transistors per area. Scaling down the critical dimension of a transistor gate brings the source and drain of that transistor closer together. The transistor source and drain may also be brought closer together due to increases in source/drain (S/D) underlap, which is the extent that the S/D extends under the gate electrode or gate stack. This becomes an issue at, for example, the 10 nm patterning node and below, since the source and drain may be so close together, that gate control over the channel may become weak. Weak gate control over the channel can lead to undesired channel current passing from the source to the drain when gate voltage is removed. Undesired channel current may also pass from source to drain due to current leakage. One option for increasing the distance between the source and drain regions is to increase gate stack spacer width to help control subsequent S/D cavity etch dimensions. However, increasing gate stack spacer width decreases the space between poly lines, thereby decreasing the space to make electrical contact with the source and drain regions, which in turn causes higher contact resistance.

Thus, and in accordance with one or more embodiments of the present disclosure, techniques are provided for improving gate control over the channel of a transistor, by increasing the effective electrical gate length ($L_{eff}$) through deposition of a gate control layer (GCL). Source and drain regions are typically formed by either implanting dopants (such as boron) into the substrate or by replacement S/D deposition, which includes etching the substrate to form S/D cavities and then depositing a heavily doped material. As will be apparent in light of this disclosure, the GCL can be used when forming a transistor using replacement S/D deposition. The GCL is a nominally undoped layer (or substantially lower doped layer, relative to the subsequently deposited heavily doped S/D fill material) that can be deposited when forming a transistor using replacement S/D deposition. The GCL can be selectively deposited in the S/D cavities after such cavities have been formed and before the heavily doped S/D fill material is deposited. In this manner, the GCL further separates the heavily doped source and drain regions, thereby increasing the effective electrical gate length ($L_{eff}$), and providing benefits to the transistor performance, as will be discussed in further detail below.

Figure 2A:
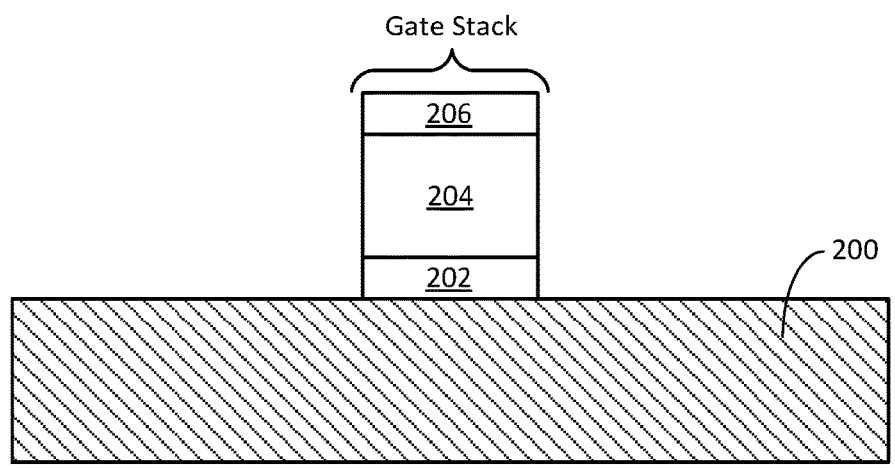
FIGS. 2A-K illustrate example structures that are formed as the method of FIG. 1 is carried out for either a planar or non-planar transistor architecture, in accordance with some embodiments. Note that FIG. 2F is an enlarged view of FIG. 2E, illustrating that the source/drain cavity does not undercut the gate dielectric layer. Further note that FIG. 2H is an enlarged view of FIG. 2G, illustrating that the GCL causes a negative source/drain underlap distance ($-X_{ud}$) with the gate dielectric layer. Further note that FIGS. 2E' and 2G' illustrate variations on the structures of FIGS. 2E and 2G, respectively, where the source and drain cavities include tip cavities. Further note that FIG. 2F' is an enlarged view of FIG. 2E', illustrating that the source/drain cavity including the source/drain cavity tip causes a positive underlap distance ($+X_{ud}$) with the gate dielectric layer. Further note that FIGS. 2H', 2H", and 2H''' are enlarged views of FIG. 2G, illustrating different resulting source/drain underlap distances ($+X_{ud}$, $X_{ud}$ of 0, and $-X_{ud}$, respectively) caused by the corresponding thickness of the GCL together with the value of the positive underlap distance ($+X_{ud}$) shown in FIG. 2F'. Further note that FIGS. 2K', 2K", and 2K''' illustrate the enlarged views of FIGS. 2H', 2H", and 2H''' after the source/drain material has been deposited in the corresponding source/drain cavities and the replacement gate processing has been performed.

The GCL can be selectively deposited in the S/D cavities after etching to form such cavities. In some instances, the etching process may cause the S/D cavities to extend under the gate stack, thereby causing S/D underlap with the gate stack. This underlap distance is referred to herein as $X_{ud}$. In instances where the S/D cavities extend under the gate stack, $X_{ud}$ is positive ($+X_{ud}$) (e.g., as shown in FIG. 2F'). In some instances, etching to form the S/D cavities may cause the cavities to extend just to the edge of the gate stack, such that $X_{ud}=0$ (e.g., as shown in FIG. 2F). In yet other instances, etching to form the S/D cavities may cause the cavities to extend only under the gate stack spacers (or even farther out), and not under the gate stack itself, such that $X_{ud}$ is negative ($-X_{ud}$). As will be apparent in light of this disclosure, $X_{ud}$ can be made more negative or otherwise decreased through the deposition of the GCL in the S/D cavities, thereby further separating the subsequently deposited heavily doped source and drain regions. The final $X_{ud}$ value is determined by the combination of the etched S/D cavities and the thickness of the GCL subsequently deposited thereon.

In some embodiments, a specific final $X_{ud}$ value may be targeted (such as approximately −3 nm), while in other embodiments, a specific range for the final $X_{ud}$ value may be targeted (such as an $X_{ud}$ in the range of −5 to 1 nm). In such embodiments, the GCL thickness may be selected based on the desired target $X_{ud}$. In some embodiments, the specific GCL thickness may be selected. For example, a thickness in the range of 1 to 6 nm may be selected for the GCL, such as 3 nm. In addition, in some embodiments, the GCL may be nominally conformal, such that the thickness of the GCL is substantially the same on all growth surfaces within the S/D cavities. In some such embodiments, substantially the same means within a factor of three or better. For example, in a specific instance where the GCL has a minimum thickness of 2 nm at one location of the S/D cavities, to be nominally conformal within a factor of three, the GCL maximum thickness (at another location of the S/D cavities) can be at most 6 nm, as will be discussed in more detail below.

In some embodiments, the GCL may be composed of nominally undoped silicon (Si), germanium (Ge), or silicon-germanium (SiGe). In some embodiments, the GCL may be minimally doped, such as having doping levels in the $1E17$ $cm^{-3}$ to $1E20$ $cm^{-3}$ range. In some embodiments, the GCL may be substantially lower doped than the subsequently deposited heavily doped S/D fill material. In such embodiments, substantially lower can include, for instance, at least one order of magnitude lower than the heavily doped S/D fill material subsequently deposited on the GCL. For example, the heavily doped S/D fill material may have doping levels in the $1E20$ $cm^{-3}$ to $9E21$ $cm^{-3}$ range, and therefore, the GCL may have doping levels below the $1E19$ $cm^{-3}$ to $1E20$ $cm^{-3}$ range. However, the GCL can have any suitable doping level as will be apparent in light of this disclosure.

Upon analysis (e.g., scanning electron microscopy and/or composition mapping), a structure configured in accordance with one embodiment will effectively show a GCL at the interface of the S/D and channel regions. Further, in some cases, transistors fabricated using a GCL as variously described herein will be able to be operated at lower voltages (since the gate voltage at which the transistor turns on for a given leakage amount will decrease) and they will exhibit less source to drain current leakage. Thus, transistor structures configured in accordance with one embodiment of the present disclosure provide an improvement over conventional structures with respect to, at least, power consumption. Such transistor structures may be used for p-type or n-type devices, or for devices including both p-type and n-type devices (e.g., CMOS), as well as for planar and non-planar (e.g., tri-gate, FinFET, nanowire/nanoribbon) transistor configurations. Such transistor structures may be formed at various processing/patterning nodes, such as at the 10 nm node and below; however, the transistor structures need not be so limited, as will be appreciated in light of this disclosure. Therefore, any number of semiconductor devices or circuitry having a need for low power consumption and/or a high degree of integration can benefit from using transistors including a GCL as variously described herein. Numerous configurations and variations will be apparent in light of this disclosure.

Architecture and Methodology

FIG. 1 is a method 100 of forming a MOS transistor including a GCL, in accordance with one or more embodiments of the present disclosure. FIGS. 2A-K illustrate example structures that are formed as the method 100 of FIG. 1 is carried out for either a planar or non-planar transistor architecture, in accordance with some embodiments. As will be apparent in light of the present disclosure, for non-planar transistor architectures, such as tri-gate or FinFET embodiments, FIGS. 2A-K may illustrate a cross-sectional view taken along the length of the semiconductor fin.

As can be seen, the example method 100 includes providing 102 a semiconductor substrate upon which a MOS device, such as a PMOS or PMOS transistor, may be formed. In some embodiments, both NMOS and PMOS transistors may be formed on the semiconductor substrate (e.g., for CMOS devices). Box 102 also includes optional shallow trench isolation (STI) processing and in such embodiments including STI processing, the n-type and p-type regions may be separated by STI (or some other suitable form of isolation in other embodiments). In some such embodiments including STI, the plane of the diffusion region is nominally planar with the top of the STI (e.g., within approximately 10 nm). In the case of non-planar architectures, such as those used for FinFET/tri-gate or nanowire/nanoribbon transistor devices, the STI locations may be where the diffusion is defined as narrow structures that are then made to exude out of the oxide plane (e.g., the level of the diffusion is 10 nm or more above the level of the top STI plane). The semiconductor substrate may be implemented, for example, with a bulk silicon, a semiconductor-on-insulator configuration (XOI, where X is a semiconductor material such as silicon, germanium, or germanium-enriched silicon), or with multi-layered structures, including those substrates upon which fins or nanowires/nanoribbons are formed prior to a subsequent gate patterning process. In other implementations, the semiconductor substrate may be formed using alternate materials, which may or may not be combined with silicon, such as germanium, silicon germanium, indium antimonide, lead telluride, indium arsenide, indium gallium arsenide, indium phosphide, gallium arsenide, or gallium antimonide. In a more general sense, any material that may serve as a foundation upon which a semiconductor device may be built can be used in accordance with embodiments of the present disclosure.

The method 100 continues with forming 104 a gate stack on the semiconductor substrate. The gate stack can be formed as conventionally done or using any suitable custom techniques. In some embodiments of the present disclosure, the gate stack may be formed by depositing and then patterning a gate dielectric layer and a gate electrode layer.

For instance, in one example case, a gate dielectric layer may be blanket deposited onto the semiconductor substrate using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric layer may be thermally grown. The gate dielectric material may be formed, for example, from materials such as silicon dioxide or high-k dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some specific example embodiments, the dummy or high-k gate dielectric layer may be between around 5 Å to around 200 Å thick (e.g., 20 Å to 50 Å). In general, the thickness of the gate dielectric layer should be sufficient to electrically isolate the gate electrode from the neighboring source and drain contacts. In further embodiments, additional processing may be performed on the high-k gate dielectric layer, such as an annealing process to improve the quality of the high-k material. Next, a gate electrode material may be deposited on the gate dielectric layer using similar deposition techniques such as ALD, CVD, or PVD. In some such specific embodiments, the gate electrode material may be polysilicon or a metal layer, although other suitable gate electrode materials can be used as well. The gate electrode material, which can be a sacrificial material that is later removed for a replacement metal gate (RMG) process, can have a thickness in the range of 50 Å to 500 Å (e.g., 100 Å), in some example embodiments. A conventional patterning process may then be carried out to etch away portions of the gate electrode layer and the gate dielectric layer to form the gate stack, as shown in FIG. 2A, for example. Use of gate first/gate last, RMG, or conventional SiO$_2$/poly gate are all compatible with this disclosure.

FIG. 2A illustrates a substrate 200 upon which a gate stack is formed. As can be seen with this example embodiment, the gate stack includes a gate dielectric layer 202 (which may be high-k gate dielectric material) and a sacrificial gate electrode 204. In one specific example case, the gate stack includes a silicon dioxide gate dielectric layer 202 and a polysilicon gate electrode 204. The gate stack may also include a gate hard mask layer 206 on top, as shown, that provides certain benefits or uses during processing, such as protecting the gate electrode 204 from subsequent ion implantation processes. The hard mask layer 206 may be formed using typical hard mask materials, such as silicon dioxide, silicon nitride, and/or other conventional dielectric materials.

With further reference to FIG. 1, after the gate stack is formed, the example method 100 continues by implanting 106 dopants into the substrate with an ion implantation process to highly dope portions of the substrate adjacent to the gate stack. The dopant used in the ion implantation process can be chosen, for example, based on its ability to increase the etch rate of the substrate material in which it is implanted, and the specific dopant selected for the ion implantation process may vary based on the substrate material(s) and the etchant used in a subsequent etching process. Specific dopants that may be selected to increase the etch rate of the substrate include, for example, carbon, phosphorous, and arsenic. For instance, carbon may be used at a dosage that ranges from $1\times10^{14}$ to $1\times10^{16}$ atoms/cm$^3$ using an implantation energy that falls between 5 and 15 kiloelectron volts (keV). Phosphorous may be used at a dosage that ranges from $1\times10^{14}$ to $5\times10^{15}$ atoms/cm$^3$ using an implantation energy that falls between 1 and 5 keV. Arsenic may be used at a dosage that ranges from $1\times10^{14}$ to $5\times10^{15}$ atoms/cm$^3$ using an implantation energy that falls between 2 and 5 keV. Other suitable dopants and dosage schemes will be apparent in light of this disclosure. In some embodiments, the ion implantation substantially occurs in a vertical direction (i.e., a direction perpendicular to substrate); while in other embodiments at least a portion of the ion implantation process occurs in an angled direction to implant ions below the gate stack. Note that the hard mask 206 can be used to prevent doping of the gate electrode 204 material.

Next, the method 100 continues with annealing 108 the substrate, which can be used to drive the dopants further into the substrate and to reduce any damage sustained by the substrate during the ion implantation process. In some embodiments, the implanting 106 and subsequent annealing 108 may drive the ions to a substrate depth that falls, for example, between 2 nm and 20 nm. The annealing 108 may be carried out at a temperature that falls, for example, between 700° C. and 1100° C. for a duration of up sixty seconds or less (e.g., five seconds). As will be appreciated, the annealing temperature and duration can vary from one embodiment to the next, depending on factors such as the diffusion rate, substrate material, dopant used, and desired end dopant concentration.

Figure 2B:
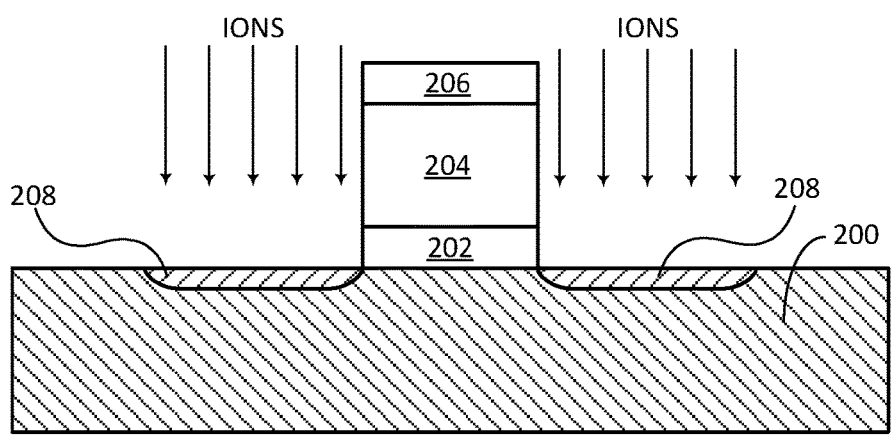
Figure 2C:
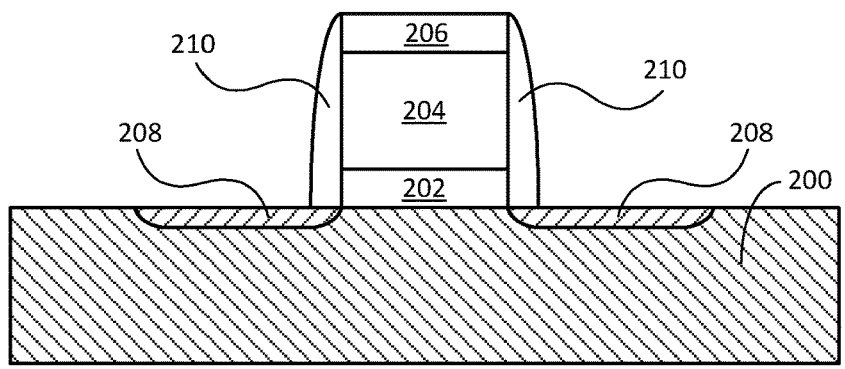

FIG. 2B illustrates the substrate 200 after the ion implantation and diffusion process. As shown in this example embodiment, the ion implantation process creates two doped regions 208 adjacent to the gate dielectric layer 202, for the MOS transistor being formed. When exposed to an appropriate etchant, the doped regions 208 may have an etch rate that is higher than the etch rate of the surrounding substrate material. One of the doped regions 208 will serve as a portion of a source region, while the other doped region 208 will serve as a portion of a drain region. Note that in the example embodiment shown, the doped regions 208 are not sited below the gate dielectric layer 202; however, in other embodiments, the doped regions 208 may be sited below the gate dielectric layer 202, which may help with the formation of epitaxial S/D tips, for example. Also note that the size of the doped regions 208, including their depth, may vary based on the requirements of the MOS transistor being formed and/or the particular process being used.

Next, the method 100 continues with forming 210 spacers on either side of the gate stack. The spacers may be formed, for example, using conventional materials such as silicon oxide, silicon nitride, or other suitable spacer materials. The width of the spacers may generally be chosen based on design requirements for the MOS transistor being formed. In accordance with some embodiments, however, the width of the spacers is not subject to design constraints imposed by the formation of the source and drain epi-tips. FIG. 3C illustrates the substrate 300 with spacers 310 formed on either side of the gate electrode layer 304 and the gate dielectric layer 302, in accordance with an example embodiment.

With further reference to FIG. 1, the method 100 continues with dry etching 110 the doped regions of the substrate to form cavities in which S/D regions may be formed. As best seen with reference to FIG. 2D, the etched cavities are generally adjacent to the gate stack. In some example embodiments, the etched cavities may be formed to a depth that falls between 20 nm and 1500 nm, which can be deeper than the doped regions. In a more general sense, the etch depth can be set as needed, based on desired MOS device requirements/performance. In some embodiments, the dry etch process can use an etchant recipe that complements the dopant used in the ion implantation process to increase the etch rate of the doped regions, thereby enabling the etching process to remove substrate material from the doped regions 208 at a faster rate than the remainder of the substrate 200.

In accordance with some embodiments, the dry etch process may use a chlorinated chemistry that takes place in a plasma reactor. In some specific such embodiments, the etchant recipe may include a combination of $NF_3$ and $Cl_2$ with argon or helium used as a buffer or carrier gas. In accordance with some such embodiments, the flow rate for the active etchant species may vary, for example, between 50 and 200 standard cubic centimeters per minute (SCCM) while the flow rate of the carrier gas may vary, for example, between 150 and 400 SCCM. A high energy plasma may be employed at a power that ranges, for instance, from 700 W to 1100 W with a low RF bias of less than 100 W, in accordance with some such embodiments. The reactor pressure may range from around 1 pascal (Pa) to around 2 Pa, in accordance with some such embodiments. In another specific example embodiment, the etchant chemistry may include a combination of HBr and $Cl_2$. In some such embodiments, the flow rate for the etchant species may vary, for example, between 40 SCCM and 100 SCCM. A high energy plasma may be employed at a power that ranges from around 600 W to around 1000 W with a low RF bias of less than 100 W, and the reactor pressure may range from around 0.3 Pa to around 0.8 Pa, in accordance with some such embodiments.

In yet another example embodiment, the etchant chemistry may include a combination of Ar and $Cl_2$. In some such embodiments, the flow rate for the etchant species may vary, for example, between 40 SCCM and 80 SCCM. A medium energy plasma may be employed at a power that ranges from around 400 W to around 800 W with a high RF bias of between around 100 W and 200 W, and the reactor pressure may range from around 1 Pa to around 2 Pa, in accordance with some such embodiments. The dry etch process times for each of these example embodiments may be, for example, up to 60 seconds per substrate, but can vary depending on factors such as desired etch depth and etchant. Such etch process parameters may vary from embodiment to embodiment, as will be appreciated.

Figure 2D:
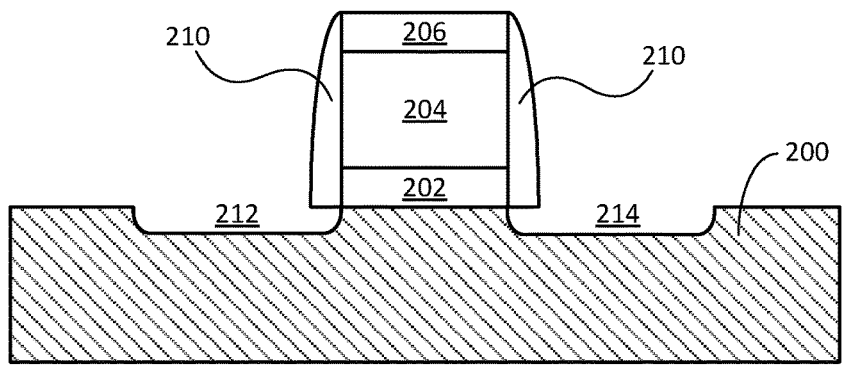
Figure 2D:
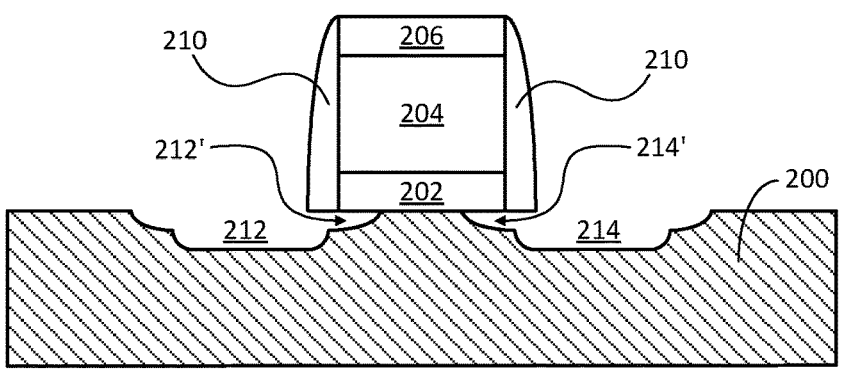

FIG. 2D illustrates the substrate 200 after the dry etch process has been carried out, in accordance with some embodiments of the present disclosure. As shown, a source cavity 212 and a drain cavity 214 are formed. In some embodiments, the dry etching 110 process may etch out portions of the doped regions that undercut the spacers 210 and the gate dielectric layer 202, thereby forming tips or extensions for the S/D cavities that underlap the gate stack. For example, FIG. 2D' shows an alternative example result of a dry etch process that results in the formation of a source tip cavity 212' and a drain tip cavity 214', which are extensions of cavities 212 and 214, respectively. Such cavity extensions/tips may occur due to increasing the etch rate of the doped regions or decreasing the width of the gate stack spacers 210, for example.

Figure 2E:
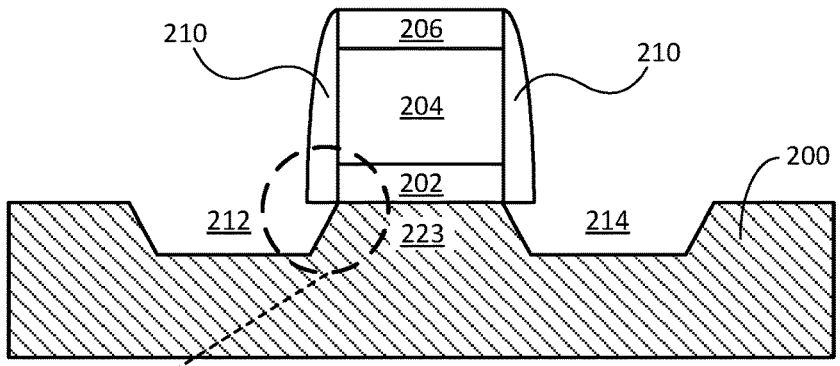
Figure 2F:
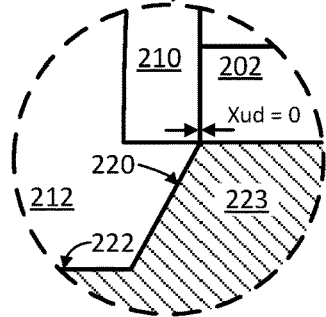
Figure 2E:
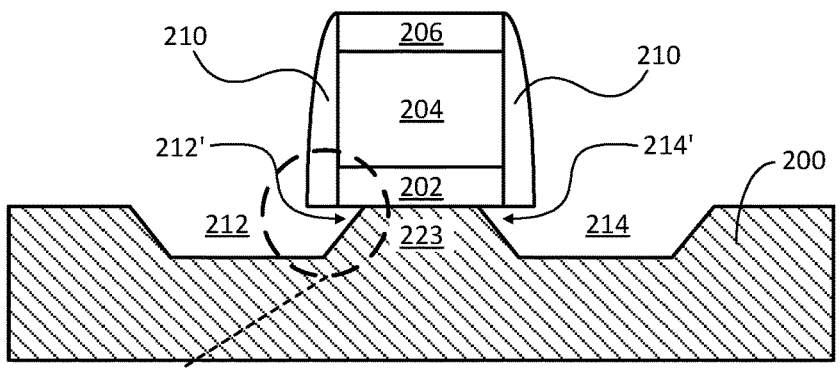
Figure 2F:
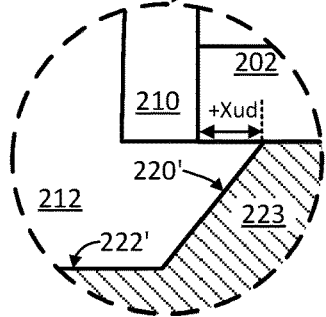

After the dry etch process has completed, and with further reference to FIG. 1, the method of this example embodiment continues with wet etching 112 to clean and further etch the source cavity 212 and the drain cavity 214. The wet etching 212, which can be carried out using conventional or custom wet etch chemistries, and can be used to remove contaminants such as carbon, fluorine, chlorofluorocarbons, and oxides such as silicon oxide to provide a clean surface upon which subsequent processes may be carried out. In addition, in embodiments using a monocrystalline silicon substrate, the wet etching 112 may also be used to remove a thin portion of the substrate along the <111> and <001> crystallographic planes to provide a smooth surface upon which a high quality epitaxial deposition may occur. In some example cases, the thin portion of the substrate that is etched away may be, for example, up to 5 nm thick and may also remove residual contaminants. As best shown in FIG. 2E, the wet etching 112 causes the sides of the source cavity 212 and the drain cavity 214 to follow the <111> and <001> crystallographic planes. However, various different cavity shapes may occur, including S/D cavities having cavity extensions or tips, as previously described. For example, FIG. 2E' shows a resulting structure including source cavity 212 with cavity extension 212' and drain cavity 214 with cavity extension 214'. Numerous different factors may affect the cavity shape/depth/dimensions, such as the etching processes used, the gate stack sidewall spacer width, and the gate length, just to name a few examples.

FIG. 2F illustrates an enlarged view of the dashed circular area from FIG. 2E and FIG. 2F' illustrates an enlarged view of the dashed circular area from FIG. 2E'. As can be seen in both FIGS. 2E and 2F, the side 220 of the source cavity 212 (and similarly, the side of the drain cavity 214) are aligned with the outside of the gate dielectric layer 202, and more generally, the cavity sides are aligned with the outside of the gate stack. Therefore, in this example structure, there is no underlap between the S/D. As previously described, the S/D underlap with the gate stack is referred to herein as $X_{ud}$. In FIGS. 2E-F, $X_{ud}=0$, since the S/D cavity etch caused the sides 220 of the cavities to align right under the outside of the gate stack. This can be compared to the example structure shown in FIGS. 2E'-F', where $X_{ud}$ is positive ($\pm X_{ud}$). $X_{ud}$ is positive in the example structure shown in FIGS. 2E'-F', because the source cavity 212 extends under the gate stack, as shown as source cavity extension 212' (and similarly for the drain cavity 214 and drain cavity extension 214'). FIG. 2F' best shows this with source cavity side 220' underlapping the gate stack. Note that the source and drain cavities are symmetrical in this disclosure for ease of description; however, that need not be the case. For example, the source cavity may have a positive $X_{ud}$, while the drain cavity may have an $X_{ud}=0$ in one embodiment. Further, in such an embodiment, as a result of the GCL variously described herein, one of the source or drain region, when formed, may not be in contact with the gate dielectric, while the other of the source or drain region, when formed may be in contact with the gate dielectric.

The method 100 of FIG. 1 continues with depositing 114 the GCL in the S/D cavities and then subsequently depositing 116 the heavily doped S/D fill material in the GCL lined S/D cavities. In some embodiments, the GCL may be deposited as a separate deposition sequence, prior to depositing the heavily doped S/D fill material. In other embodiments, the GCL and heavily doped S/D fill material may be deposited in a single deposition sequence, illustrated by the dashed box around boxes 114 and 116 in the method 100 of FIG. 1. In such embodiments, there may either be a graded or abrupt transition between the deposition of the GCL and the heavily doped S/D fill material. Either way, the heavily doped S/D fill material satisfies the contact requirement on the top surface, while the undoped (or substantially lower doped) layer provides the channel to S/D interface benefits described herein. The GCL may be selectively deposited in the S/D cavities, meaning that it only sticks to the S/D cavity material (e.g., Si) and not to the insulator regions surrounding the gate. Such selective deposition may be performed using a chemical vapor deposition (CVD) technique or any other suitable technique, such as an ultra-high vacuum CVD (UHV-CVD), rapid thermal CVD (RT-CVD), low pressure CVD (LP-CVD), or gas source molecular beam epitaxy (GS-MBE). The deposition of the GCL may be possible over a wide range of conditions and may be epitaxial or polycrystalline.

GCL deposition temperatures, pressures, flow rates, carrier gases, etc. may be selected based on the material(s) of the GCL being deposited. In some embodiments, the GCL may be composed of nominally undoped silicon (Si), germanium (Ge), or silicon-germanium (SiGe). For example, for n-type devices, the GCL may be selected to be Si, while for p-type devices, the GCL may be selected to be SiGe or Ge. In other embodiments, the GCL may be minimally doped, for example, in the $1E17$ $cm^{-3}$ to $1E20$ $cm^{-3}$ level, or lower. The dopants may be determined based on the heavily doped S/D fill material that is subsequently deposited. For example, for n-type devices, phosphorous (P) or boron (B) may be used as the dopant, for p-type devices, aluminum (Al), gallium (Ga), indium (In), arsenic (As), or antimony (Sb) may be used as the dopant. In some embodiments, the GCL may include minimal levels of other suitable dopants based on the channel and/or S/D fill materials. In some embodiments, the GCL minimal dopant level may be one order of magnitude lower than the bulk of the heavily doped S/D fill material, in terms of atoms per $cm^3$.

The heavily doped S/D fill material may include an in situ boron doped germanium or boron doped silicon germanium capped with a heavily boron doped germanium layer, in some embodiments. For n-type devices, the dopants used for the heavily doped S/D fill materials may include P or B, while for p-type devices, the dopants may include Al, Ga, In, As, or Sb, for example. The heavily doped S/D fill material may be doped in the $1E19$ to $9E21$ $cm^{-3}$ range, but in some embodiments, is doped in the $1E20$ to $9E21$ $cm^{-3}$ range. In one or more embodiments, any compatible set of materials can be used for the GCL and heavily doped S/D, so long as defects are kept low enough to avoid gross diffusion from the contact portion of the film and the doping difference is maintained through end-of-line.

A CVD process or other suitable deposition technique may be used for the deposition 116 of the heavily doped S/D fill material. For example, the deposition 116 may be carried out in a CVD reactor, an LPCVD reactor, or an ultra-high vacuum CVD (UHVCVD). In some example cases, the reactor temperature may fall, for instance, between 600° C. and 800° C. and the reactor pressure may fall, for instance, between 1 and 760 Torr. The carrier gas may include, for example, hydrogen or helium at a suitable flow rate, such as between 10 and 50 SLM. In some specific embodiments, the deposition may be carried out using a germanium source precursor gas such as $GeH_4$ that is diluted in $H_2$ (e.g., the $GeH_4$ may be diluted at 1-5%). For instance, the diluted $GeH_4$ may be used at a 1% concentration and at a flow rate that ranges between 50 and 300 SCCM. For an in situ doping of boron, diluted $B_2H_6$ may be used (e.g., the $B_2H_6$ may be diluted in $H_2$ at 1-5%). For instance, the diluted $B_2H_6$ may be used at a 3% concentration and at a flow rate that ranges between 10 and 100 SCCM. In some example cases, an etching agent may be added to increase the selectivity of the deposition. For instance, HCl or $Cl_2$ may be added at a flow rate that ranges, for example, between 50 and 300 SCCM.

Figure 2G:
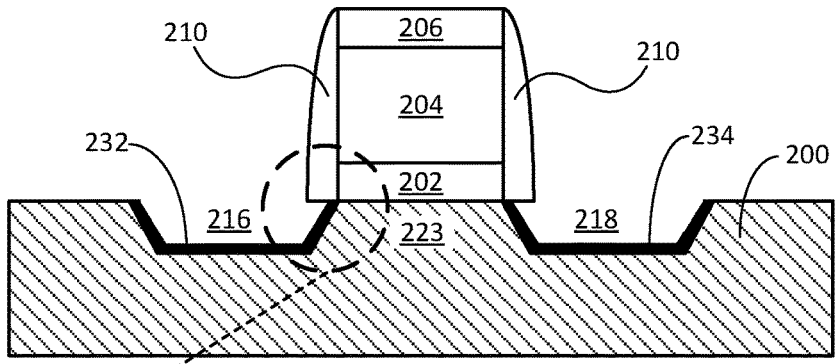
Figure 2H:
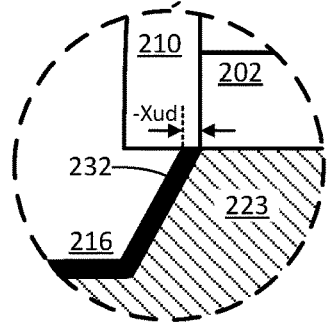
Figure 2G:
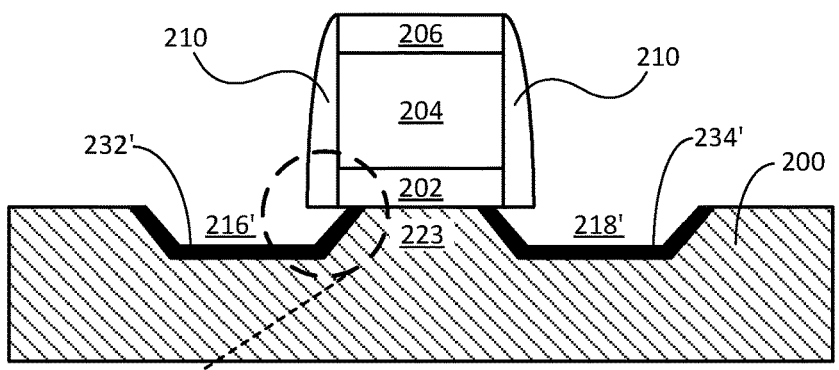
Figure 2H:
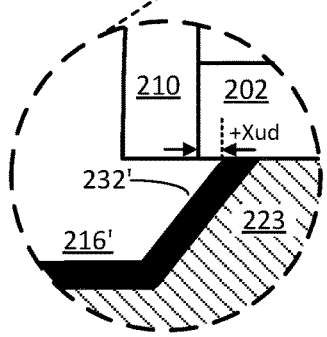
Figure 2H:
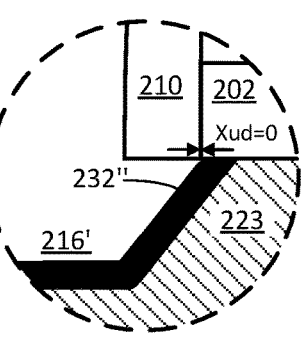
Figure 2H:
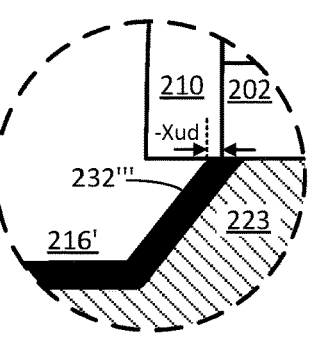

FIG. 2G illustrates an example structure after a GCL 232, 234 has been deposited in the S/D cavities of the structure of Figure E, in accordance with an embodiment of the present disclosure. FIG. 2G' illustrates an example structure after a GCL 232', 234' has been deposited in the S/D cavities of the structure of Figure E', in accordance with an embodiment of the present disclosure. In accordance with implementations of the invention, the GCL 232, 232', 234, 234' is a layer that is physically distinct from the channel region 223 and is formed after the source cavity 212 and the drain cavity 214 have been formed. FIG. 2H illustrates an enlarged view of the dashed circular area from FIG. 2G and FIGS. 2H', 2H", and 2H'" illustrates an enlarged views of the dashed circular area from FIG. 2G. For ease of description, only the source cavity 212 and GCL 232 deposited thereon will be discussed; however, the description applies to the drain cavity 214 and GCL 234 deposited thereon, since the source and drain are symmetrical in this example structure.

Figure 2I:
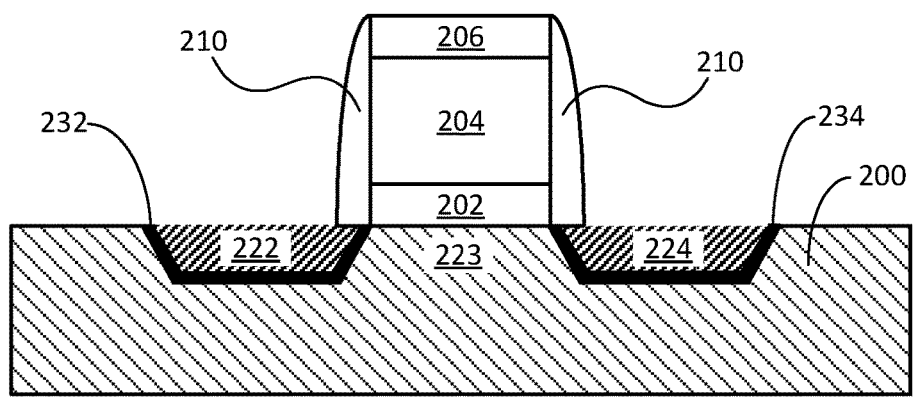
Figure 2J:
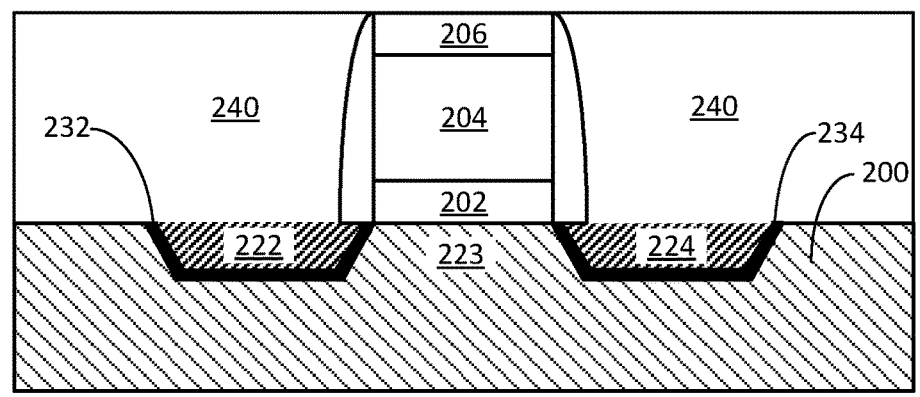

FIGS. 2G-H show a structure where the S/D cavities started with an $X_{ud}$ of 0 and then a GCL was deposited to decrease $X_{ud}$ to a negative value ($-X_{ud}$), as can best be seen in FIG. 2H. As shown, the GCL 232 serves to pull the channel 223 out from under the edge of the gate, thereby creating a modified source cavity 216 (and a modified drain cavity 218) for subsequent deposition of the heavily doped S/D fill material. FIG. 2I shows the resulting structure after the heavily doped S/D fill material 222, 224 has been deposited in the modified S/D cavities 216, 218. As can be seen in FIG. 2I, the heavily doped source material 222 and drain material 224 are further separated by the addition of the nominally undoped (or substantially lower doped) GCL, thereby increasing the effective electrical gate length ($L_{eff}$). FIGS. 2G'-H' show a structure where the S/D cavities started with a positive $X_{ud}$ and then a GCL was deposited to decrease $X_{ud}$ to a smaller value, as can best be seen in FIG. 2H'. FIGS. 2G'-H' provide an additional example of how the GCL 232', 234' can be used to pull the source and drain regions further apart. In addition, as previously described, the final target $X_{ud}$ caused by the GCL may be positive, 0, or negative (e.g., in the range of −5 to 1 nm). Thus, FIG. 2H" illustrates a variation on the structure of FIG. 2H' where the S/D cavities again started with a positive $X_{ud}$ (e.g., the $+X_{ud}$ shown in FIG. 2F') and then a GCL 232" was deposited to cause the final $X_{ud}$ to be 0, as shown. Further, FIG. 2H'" illustrates a variation on the structure of FIG. 2H' wherein the S/D cavities again started with a positive $X_{ud}$ (e.g., the $+X_{ud}$ shown in FIG. 2F') and then a GCL 232'" was deposited to cause the final $X_{ud}$ to be negative ($-X_{ud}$), as shown.

In some embodiments, the thickness of the GCL may be selected as a desired value or value range, such as 1-6 nm thick, or some other suitable thickness. In some embodiments, the thickness of the GCL may be determined based on the desired final $X_{ud}$ for the S/D regions. In such embodiments, the thickness of the GCL may be selected based on the $X_{ud}$ resulting from the etching of the S/D cavities. In one example embodiment, the target final $X_{ud}$ after GCL deposition is approximately −3 nm. In such an example embodiment, where the $X_{ud}$ after S/D etch is 0, the GCL thickness would be ~3 nm to achieve the desired target final $X_{ud}$. In another example embodiment, the target final $X_{ud}$ is in the range of −5 to 1 nm. In some embodiments, the GCL may be nominally conformal, such that the thickness of the GCL is substantially the same on all growth surfaces within the S/D cavities. In some such embodiments, substantially the same means within a factor of three or better. For example, in a specific instance where the GCL has a minimum thickness of 2 nm at one location of the S/D cavities, to be nominally conformal within a factor of three, the GCL maximum thickness (at another location of the S/D cavities) can be at most 6 nm, as will be discussed in more detail below. In a more specific example, where the GCL has a minimum thickness of 2 nm (and doesn't exceed 6 nm) on the sides of the S/D cavities (such as side 220 of source cavity 212 from FIG. 2F) to be nominally conformal within a factor of three, the GCL thickness of the bottom of the S/D cavities (such as bottom 222 of source cavity 212 from FIG. 2F) can be at most 6 nm at its thickest (as long as its thinnest area is at least 2 nm).

In some embodiments of the present disclosure where a replacement metal gate process may be used, the method 100 may continue with removing 120 the gate stack (including the dummy gate dielectric layer 202, the sacrificial gate electrode 204, and the hard mask layer 206) using an etching process as is commonly done. In alternate implementations, only the hard mask 206 and sacrificial gate 204 may be removed, leaving the high-k gate dielectric layer 202, if used. If the gate dielectric layer 202 is removed, the method may continue with depositing 122 a new gate dielectric layer 252 into the trench opening. Any suitable high-k dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, during the deposition of the GCL and/or highly doped S/D fill materials, and/or to replace a low-k (or sacrificial dielectric material) with a high-k (or otherwise desired) gate dielectric material.

Figure 2K:
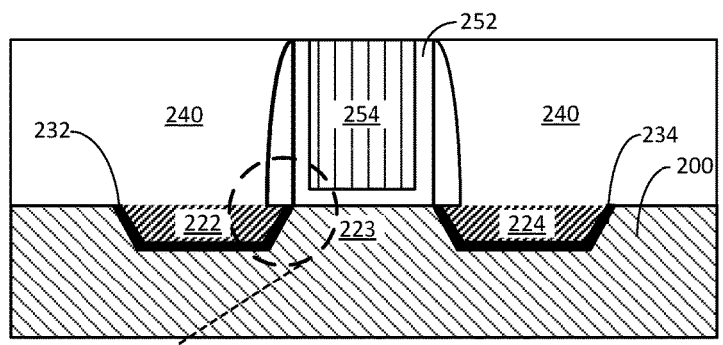

The method 100 may then continue with depositing 124 the metal gate electrode layer into the trench and over the gate dielectric layer (whether or not high-k gate dielectric later 202 was replaced by new gate dielectric layer 252). FIG. 2K illustrates an example structure after high-k gate dielectric layer 252 and metal gate electrode 254 have been deposited into the trench opening, in accordance with one embodiment. Various metal deposition processes may be used to form the metal gate electrode layer, such as CVD, ALD, PVD, electroless plating, or electroplating, just to name a few example processes. The metal gate electrode layer may include, for example, a p-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited followed by a suitable metal gate electrode fill metal, such as aluminum. Note that FIGS. 2K', 2K", and 2K'" illustrate the enlarged views of FIGS. 2H', 2H", and 2H'" after the source/drain material has been deposited in the corresponding source/drain cavities and the replacement gate processing has been performed.

The method 100 may include additional or alternative processes as will be apparent in light of this disclosure. For example, the method may continue with the deposition of S/D metal contacts or contact layers after etching to the source drain regions. Such metallization of the source and drain contacts can be carried out using a silicidation process (generally, deposition of contact metal and subsequent annealing). For instance, silicidation with nickel, aluminum, nickel-platinum or nickel-aluminum or other alloys of nickel and aluminum, or titanium with or without germanium pre-amorphization implants can be used to form a low resistance germanide. As previously described, transistor devices including a GCL as described herein may be p-type or n-type transistors, or the devices may include a combination of p-type and n-type transistors (e.g., for CMOS devices).

Non-Planar Configuration

A non-planar architecture can be implemented, for instance, using finned (e.g., tri-gate or FinFET) or nanowire/nanoribbon configurations. Finned configurations include a transistor built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such configurations have been termed as FinFET and tri-gate transistors. Other types of finned configurations can also be used, such as so-called double-gate FinFETs, in which the conductive channel principally resides only along the two sidewalls of the fin (and not along the top of the fin, for example). Nanowire/nanoribbon transistor configurations (sometimes referred to as gate-all-around (GAA) FET) are configured very similarly, but instead of a fin structure, nanowires/nanoribbons (e.g., made from silicon, germanium, or silicon-germanium material) are used and the gate material generally surrounds the channel region on all sides. Depending on the particular design, nanowire/nanoribbon transistors may have, for instance, four effective gates.

Figure 3A:
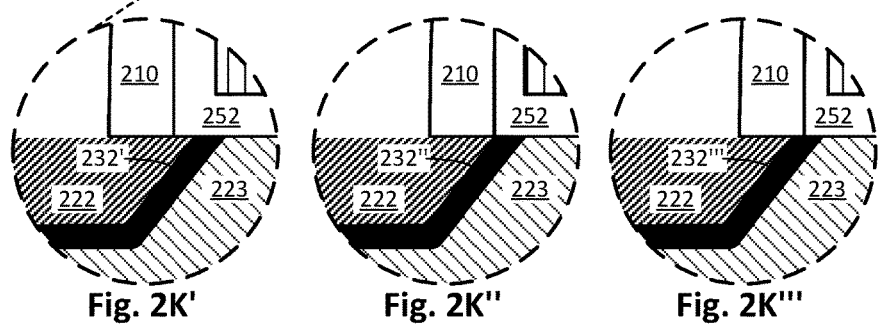
FIGS. 3A-C show perspective views of example non-planar architecture structures including a GCL, configured in accordance with an embodiment of the present disclosure.
Figure 3A:
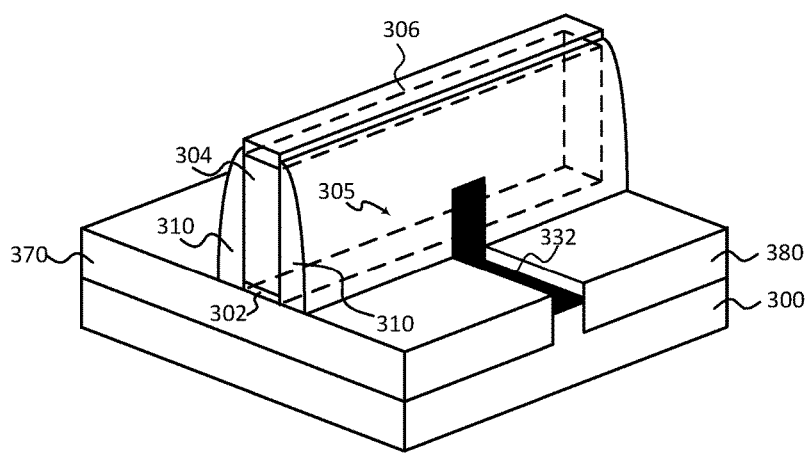
Figure 3B:
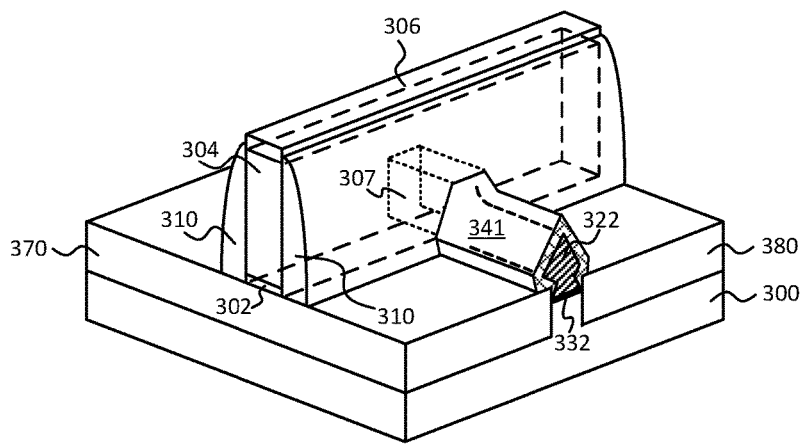
Figure 3C:
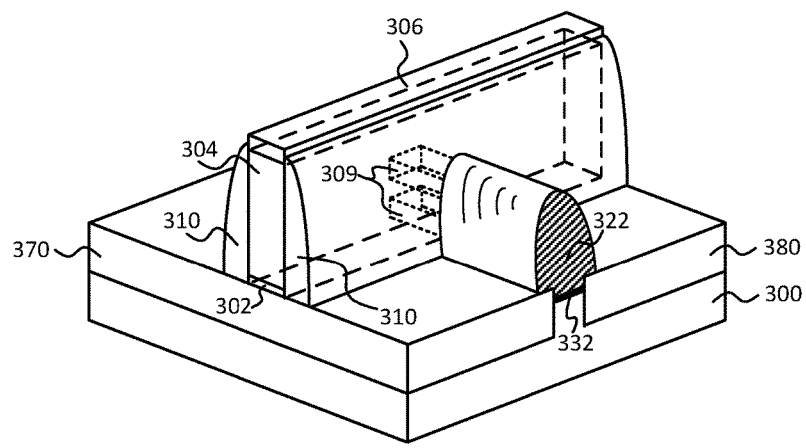
Figure 3C:
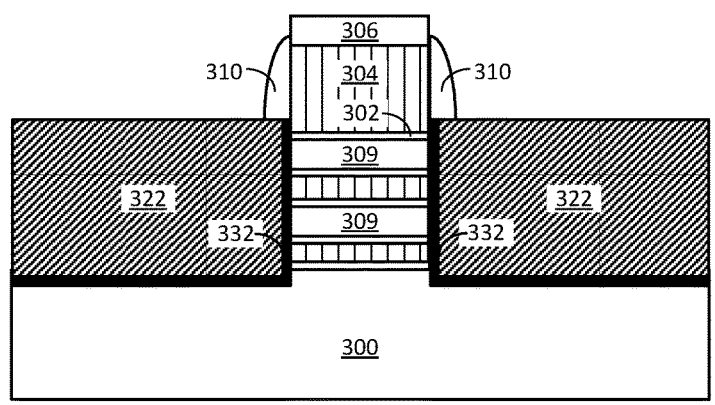

FIGS. 3A-B show perspective views of example tri-gate architectures including a GCL, configured in accordance with an embodiment of the present disclosure. More specifically, FIG. 3A shows a tri-gate structure analogous to FIG. 2G, and FIG. 3B shows a tri-gate structure analogous to FIG. 2I. As will be appreciated in light of this disclosure, conventional processes and forming techniques can be used to fabricate the tri-gate transistor structures shown in FIGS. 3A-B. However, and in accordance with one or more embodiments of the present disclosure, a gate control layer (GCL) can be deposited at the interface of the channel and the source/drain regions to improve the gate control over the channel. As can be seen, the tri-gate device includes a substrate 300 having a semiconductor body or fin 305 (represented by dashed lines) extending from the substrate 300 through isolation regions 370, 380. In one embodiment, the isolation regions 370, 380 are shallow trench isolation (STI) regions formed using conventional techniques, such as etching the substrate 300 to form trenches, and then depositing oxide material onto the trenches to form the STI regions. The isolation regions 370, 380 can be made from any suitable dielectric/insulative materials, such as $SiO_2$. A gate electrode 304 is formed over 3 surfaces of the fin 305 to form three gates. A hard mask 306 is formed on top of the gate electrode 304. Gate spacers 310 are formed at opposite sidewalls of the gate electrode 304.

FIG. 3A shows the GCL 332 deposited in the source cavity and FIG. 3B shows the heavily doped source/drain fill material 322 deposited on the GCL 332, using a replacement process, and an optional cap layer 341 deposited thereon. As can be seen in FIG. 3B, the channel region 307 extends from the source to the drain under the gate. FIG. 3C shows another alternative, which includes a nanowire/nanoribbon channel architecture 309. Similar to the fin structure shown in FIG. 3B, the nanowire/nanoribbon structure shown in FIG. 3C includes GCL 332 and source/drain regions 322.

Source/drain regions 322 can be formed using a replacement process that includes heavily doped S/D fill materials. In the example shown in FIG. 3C, the structure includes multiple (two) nanowires/nanoribbons 309. However, the structure may include only one nanowire/nanoribbon or more than two nanowires/nanoribbons, as will be apparent in light of this disclosure. The previous discussion with respect to the GCL 332 and heavily doped S/D regions 322 is equally applicable here. Note that only one source/drain region 322 is shown in FIGS. 3B-C, but numerous such regions can be implemented in a similar fashion (including both n-type and p-type S/D regions, as well as a combination of n-type and p-type regions for, e.g., CMOS devices). Also note that the example shapes of the source/drain regions 322 and optional cap 341 are provided for illustrative purposes and are not intended to limit the present disclosure. Further note that FIG. 3C' illustrates a cross-sectional view of FIG. 3C taken through the source/drain regions and perpendicular to the gate structure. FIG. 3C' illustrates that the GCL 332 is in contact with the gate dielectric layer 302 and also that the gate structure (including gate dielectric layer 302 and gate electrode 304) wraps around the nanowires/nanoribbons 309.

Gate Control Layer (GCL) Benefits

Figure 4A:
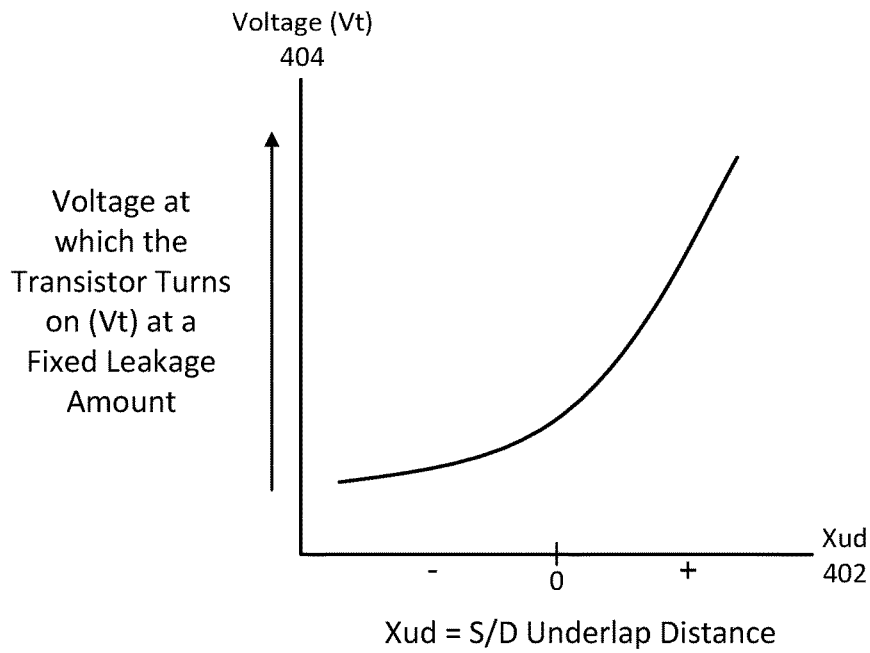
FIG. 4A is a graph illustrating voltage at which the transistor turns on ($V_t$) at a fixed leakage amount versus source/drain (S/D) underlap distance ($X_{ud}$) for a transistor including a GCL, in accordance with some embodiments of the present disclosure.
Figure 4B:
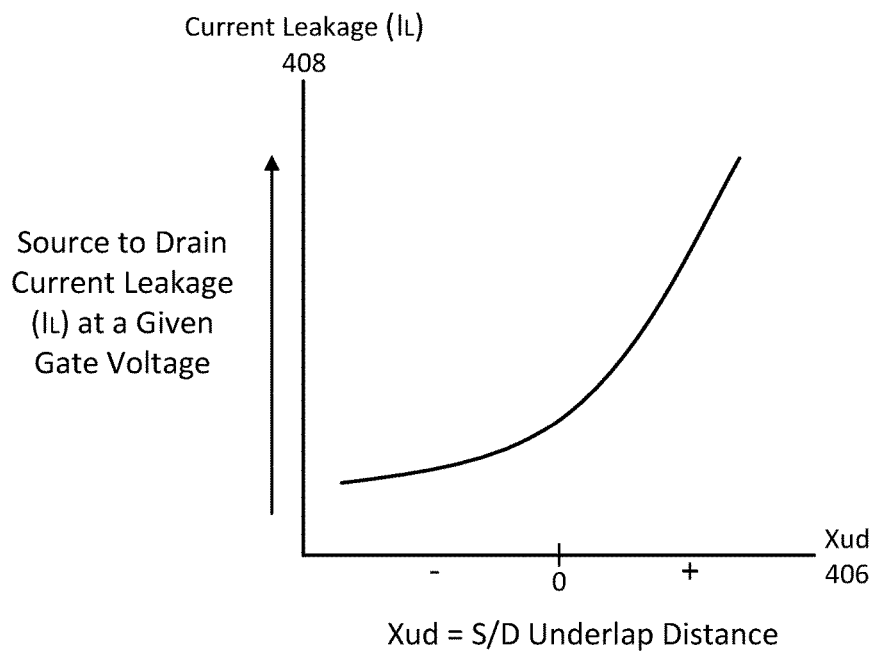
FIG. 4b is a graph illustrating source to drain current leakage ($I_L$) at a given gate voltage versus S/D underlap distance ($X_{ud}$) for a transistor including a GCL, in accordance with some embodiments of the present disclosure.

FIG. 4A is a graph illustrating voltage at which the transistor turns on ($V_t$) 404 at a fixed leakage amount versus S/D underlap distance ($X_{ud}$) 402 for a transistor including a GCL, in accordance with some embodiments of the present disclosure. As can be seen in this graph, as $X_{ud}$ 402 decreases up to a certain point, $V_t$ 404 decreases (at a fixed leakage amount), resulting in the benefit of being able to run a transistor at a lower voltage level. FIG. 4b is a graph illustrating source to drain current leakage ($I_L$) 408 at a given gate voltage versus S/D underlap distance ($X_{ud}$) 406 for a transistor including a GCL, in accordance with some embodiments of the present disclosure. As can be seen in this graph, as $X_{ud}$ 406 decreases up to a certain point, $I_L$ 408 decreases (at a given gate voltage amount), resulting in the benefit of lower current leakage between the source and drain. As $X_{ud}$ decreases, the separation between the heavily doped source and drain regions increases, thereby increasing the effective electrical gate length ($L_{eff}$) and improving the control that the gate has over the channel. Note that both graphs show that negative $X_{ud}$ is favorable, which can be achieved using a GCL during transistor formation as variously described herein. Also note that the GCL may be particularly beneficial in transistor generations having gate lengths less than approximately 20 nm, since it can increase $L_{eff}$ and serve to pull the channel out from the gate edge to provide the benefits described herein. Therefore, using a GCL leads to an improvement in transistor performance, especially for low power applications.

Example System

Figure 5:
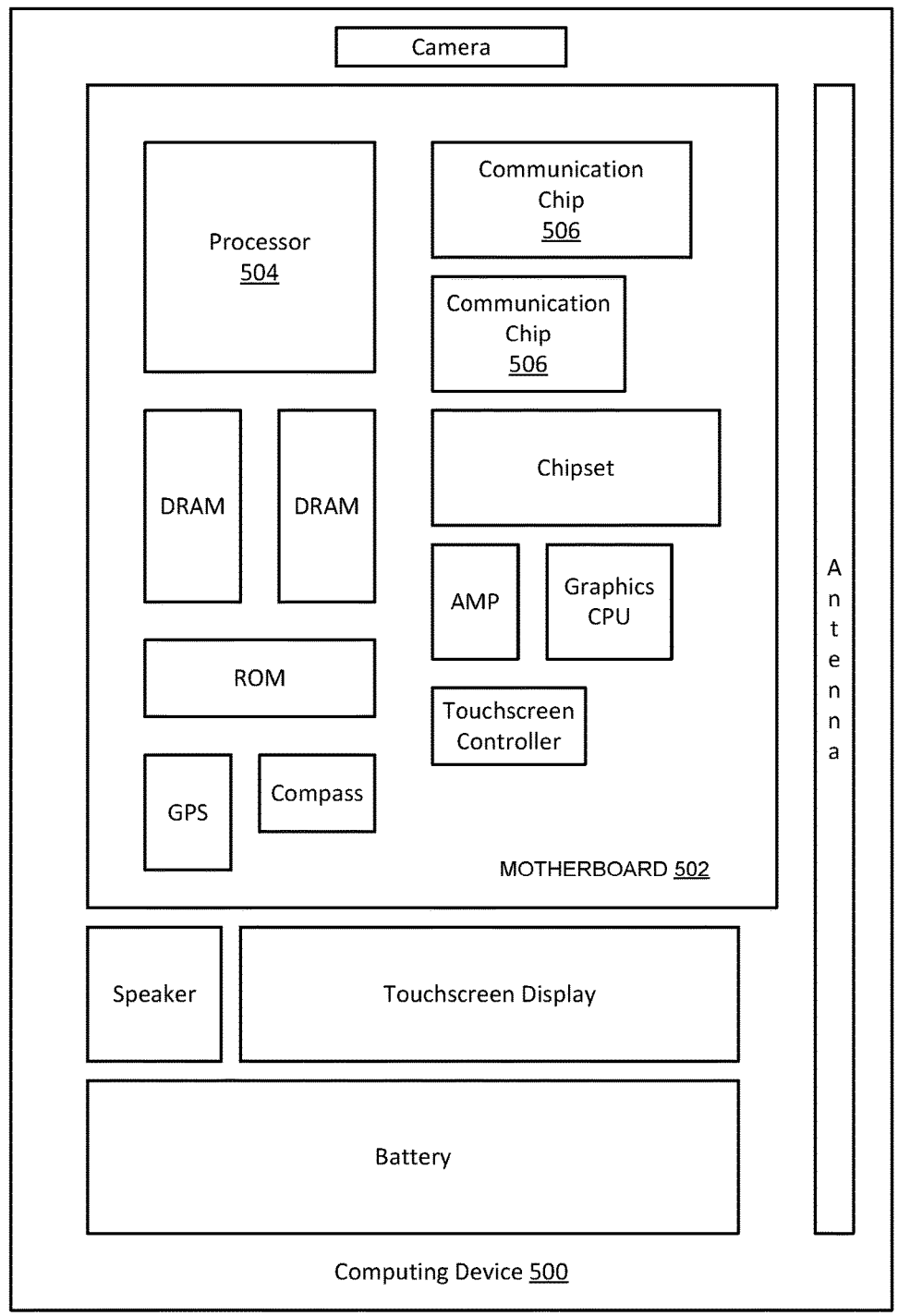
FIG. 5 illustrates a computing system implemented with one or more transistor structures configured in accordance with an example embodiment.

FIG. 5 illustrates a computing system 500 implemented with one or more transistor structures configured in accordance with an example embodiment. As can be seen, the computing system 500 houses a motherboard 502. The motherboard 502 may include a number of components, including but not limited to a processor 504 and at least one communication chip 506, each of which can be physically and electrically coupled to the motherboard 502, or otherwise integrated therein. As will be appreciated, the motherboard 502 may be, for example, any printed circuit board, whether a main board or a daughterboard mounted on a main board or the only board of system 500, etc. Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 500 may include one or more transistor structures as variously described herein (e.g., a transistor fabricated with a GCL at the source/drain and channel interface). These transistor structures can be used, for instance, to implement an on-board processor cache or memory array. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as NFC, Wi-Fi, and Bluetooth, and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard memory circuitry that is implemented with one or more transistor structures as variously described herein. The term "processor" may refer to any device or portion of a device that processes, for instance, electronic data from registers and/or memory to transform that electronic data into other electronic data that may be stored in registers and/or memory.

The communication chip 506 may also include an integrated circuit die packaged within the communication chip 506. In accordance with some such example embodiments, the integrated circuit die of the communication chip includes one or more devices implemented with one or more transistor structures as variously described herein (e.g., on-chip processor or memory). As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 500 may be any other electronic device that processes data or employs one or more transistor devices as variously described herein.

Further Example Embodiments

The following examples pertain to further embodiments, from which numerous permutations and configurations will be apparent.

Example 1 is a transistor device, comprising: a substrate having a channel region; a gate stack above the channel region, the gate stack including a gate electrode and a gate dielectric; source and drain regions including doped fill material formed in the substrate and adjacent to the channel region; and a gate control layer (GCL) formed in each of the source and drain regions at least between the doped fill material and channel region, wherein the GCL has no doping or a maximum doping level that is lower than the levels of the doped fill material.

Example 2 includes the subject matter of Example 1, wherein the GCL has doping levels below $1E20$ $cm^{-3}$.

Example 3 includes the subject matter of Example 1 or 2, wherein the GCL is undoped.

Example 4 includes the subject matter of any of the preceding Examples, wherein the GCL is composed of at least silicon (Si), germanium (Ge), and/or silicon-germanium (SiGe).

Example 5 includes the subject matter of any of the preceding Examples, wherein the GCL has a thickness of 1 to 6 nm.

Example 6 includes the subject matter of any of the preceding Examples, wherein the GCL decreases each of the source and drain underlap distances with respect to the gate stack, such that the underlap distances are each in the range of 1 to −5 nm.

Example 7 includes the subject matter of any of the preceding Examples, wherein the source and drain fill material is heavily doped in the $1E20$ $cm^{-3}$ to $9E21$ $cm^{-3}$ range.

Example 8 includes the subject matter of any of the preceding Examples, wherein the GCL increases the electrical effective gate length.

Example 9 includes the subject matter of any of the preceding Examples, wherein the GCL is composed of the same material as the source and drain fill material, but the GCL material is undoped or has doping levels that are lower than the source and drain fill material by at least one order of magnitude in terms of atoms per $cm^3$.

Example 10 includes the subject matter of any of the preceding Examples, wherein the gate stack length is less than 20 nm.

Example 11 includes the subject matter of any of the preceding Examples, wherein the device is a planar transistor.

Example 12 includes the subject matter of any of Examples 1-10, wherein the device has a fin-based, nanowire, or nanoribbon transistor structure.

Example 13 is an integrated circuit comprising the device of any of the preceding Examples.

Example 14 is an integrated circuit comprising the device of any of Examples 1-12.

Example 15 is a transistor device, comprising: includes the subject matter of any of Examples 1-14, wherein a substrate having a channel region; a gate electrode above the channel region, wherein a gate dielectric layer is provided between the gate electrode and the channel region, and spacers are provided on either side of the gate electrode; heavily doped source and drain regions formed in the substrate and adjacent to the channel region, wherein the source and drain regions include fill material that has doping levels in excess of $1E20$ $cm^{-3}$; and a gate control layer (GCL) formed in each of the source and drain regions at least between the heavily doped source/drain (S/D) fill material and channel region, wherein the GCL has doping levels below $1E20$ $cm^{-3}$ and the GCL further separates the heavily doped source and drain regions by decreasing the underlap distance of the heavily doped S/D fill material with respect to the gate dielectric layer.

Example 16 includes the subject matter of Example 15, wherein the heavily doped S/D fill material underlap distance with respect to the gate dielectric layer is in the range of 1 to −5 nm.

Example 17 includes the subject matter of either Example 15 or 16, wherein the heavily doped S/D fill material underlap distance with respect to the gate dielectric layer is approximately −3 nm.

Example 18 includes the subject matter of any of Examples 15-17, wherein the GCL is composed of the same material as the source and drain fill material, but the GCL material is undoped or has doping levels that are lower than the source and drain fill material by at least one order of magnitude in terms of atoms per $cm^3$.

Example 19 includes the subject matter of any of Examples 15-18, wherein the GCL is composed of at least silicon (Si), germanium (Ge), and/or silicon-germanium (SiGe).

Example 20 includes the subject matter of any of Examples 15-19, wherein the GCL is doped at levels in the $1E17$ $cm^{-3}$ to $1E20$ $cm^{-3}$ range.

Example 21 includes the subject matter of any of Examples 15-20, wherein the GCL has a thickness in the 1 to 6 nm range.

Example 22 includes the subject matter of any of Examples 15-21, wherein the GCL increases the electrical effective gate length.

Example 23 includes the subject matter of any of Examples 15-22, wherein the GCL decreases the voltage at which the transistor turns on at a fixed leakage amount.

Example 24 includes the subject matter of any of Examples 15-23, wherein the GCL decreases source to drain current leakage at a given gate voltage.

Example 25 includes the subject matter of any of Examples 15-24, wherein the transistor device is a p-type or n-type device.

Example 26 is a complementary metal-oxide semiconductor (CMOS) integrated circuit comprising at least one p-type transistor device of any of Examples 15-25 and at least one n-type transistor device of any of Examples 15-25.

Example 27 is a mobile computing system comprising the transistor device of any of Examples 15-25.

Example 28 is a method for forming a transistor device, comprising: providing a substrate having a channel region; providing a gate electrode above the channel region, wherein a gate dielectric layer is provided between the gate electrode and the channel region and spacers are provided on sides of the gate electrode; etching to form source and drain cavities in the substrate and adjacent to the channel region; selectively depositing a gate control layer (GCL) in each of the source and drain cavities, wherein the gate control layer has doping levels below 1E20 cm$^{-3}$; and depositing heavily doped source/drain (S/D) fill material on the gate control layer, wherein the heavily doped S/D fill material has doping levels in excess of 1E20 cm$^{-3}$.

Example 29 includes the subject matter of Example 28, wherein the GCL and heavily doped S/D fill material are deposited in a single deposition sequence.

Example 30 includes the subject matter of Example 29, wherein there is a graded transition in terms of level of doping between the deposition of the GCL and the deposition of the heavily doped S/D fill material.

Example 31 includes the subject matter of any of Examples 28-30, wherein the GCL is nominally conformal after deposition, such that the thickness of the GCL is substantially the same on all growth surfaces within the source and drain cavities.

Example 32 includes the subject matter of Example 31, wherein substantially the same on all growth surfaces means at least within a factor of three.

Example 33 includes the subject matter of any of Examples 28-32, wherein the GCL is composed of the same material as the source and drain fill material, but the GCL material is undoped or has doping levels that are lower than the source and drain fill material by at least one order of magnitude in terms of atoms per cm$^3$.

Example 34 includes the subject matter of any of Examples 28-33, wherein the GCL has a thickness of 1 to 6 nm.

Example 35 includes the subject matter of any of Examples 28-34, wherein the GCL decreases the heavily doped S/D fill material underlap distance with respect to the gate dielectric layer such that the heavily doped S/D fill material underlap distance with respect to the gate dielectric layer is in the range of 1 to −5 nm.

Example 36 includes the subject matter of any of Examples 28-35, wherein the underlap distance of the source and drain cavities with respect to the gate dielectric layer is 0 after etching to form the source and drain cavities.

Example 37 includes the subject matter of any of Examples 28-36, wherein the heavily doped S/D fill material underlap distance with respect to the gate dielectric layer is approximately −3 nm.

Example 38 includes the subject matter of any of Examples 28-37, further comprising removing and subsequently replacing the gate dielectric layer and the gate electrode.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor device, the integrated circuit comprising:
    a body including semiconductor material;
    a gate structure above the body, the gate structure including a gate electrode and a gate dielectric between the gate electrode and the body;
    a source region and a drain region, the body between the source and drain regions, wherein the source and drain regions include semiconductor material that has doping levels in excess of 1E20 cm$^{-3}$; and
    a layer between the source region and the body, the layer also between the drain region and the body, the layer having a thickness of 1 to 6 nanometers, wherein the layer includes semiconductor material and has doping levels below 1E20 cm$^{-3}$, and wherein the layer is in contact with the gate dielectric;
    wherein at least one of the source region or the drain region is not in contact with the gate dielectric.

2. The integrated circuit of claim 1 wherein the layer has a thickness of 3 nanometers.

3. The integrated circuit of claim 1 wherein neither the source region nor the drain region is in contact with the gate dielectric.

4. The integrated circuit of claim 1 wherein the at least one of the source region or the drain region that is not in contact with the gate dielectric is at most 5 nanometers away from the gate dielectric.

5. The integrated circuit of claim 1 wherein one of the source region or the drain region is in contact with the gate dielectric.

6. The integrated circuit of claim 5 wherein the one of the source region or the drain region that is in contact with the gate dielectric is under the gate dielectric such that there is an underlap distance of 1 nanometer with respect to the gate dielectric.

7. The integrated circuit of claim 1 wherein the body is a fin and the body is between two portions of the gate structure.

8. The integrated circuit of claim 1 wherein the body is a nanowire or nanoribbon and the gate structure wraps around the body.

* * * * *